(12) United States Patent
Okumura et al.

(10) Patent No.: US 7,601,619 B2
(45) Date of Patent: Oct. 13, 2009

(54) METHOD AND APPARATUS FOR PLASMA PROCESSING

(75) Inventors: Tomohiro Okumura, Osaka (JP); Yuichiro Sasaki, Tokyo (JP); Katsumi Okashita, Osaka (JP); Hiroyuki Ito, Chiba (JP); Bunji Mizuno, Nara (JP); Cheng-Guo Jin, Osaka (JP); Ichiro Nakayama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/887,821

(22) PCT Filed: Apr. 4, 2006

(86) PCT No.: PCT/JP2006/307126

§ 371 (c)(1),
(2), (4) Date: Sep. 10, 2008

(87) PCT Pub. No.: WO2006/107044

PCT Pub. Date: Oct. 12, 2006

(65) Prior Publication Data

US 2009/0068769 A1     Mar. 12, 2009

(30) Foreign Application Priority Data

Apr. 4, 2005     (JP) ............................. 2005-107775

(51) Int. Cl.
*H01L 21/31* (2006.01)
*H01L 21/469* (2006.01)
*H01L 21/42* (2006.01)
*H01J 37/32* (2006.01)
*C23F 4/00* (2006.01)

(52) U.S. Cl. ......................... 438/513; 438/17; 438/514; 438/485; 438/788; 438/789; 438/709; 438/792; 438/793; 427/523; 427/524; 427/525; 427/530; 427/531; 118/722; 118/723 MW; 118/723 E; 216/67; 216/69; 216/71; 257/E21.143; 257/E21.218

(58) Field of Classification Search .......... 257/E21.143, 257/E21.218
See application file for complete search history.

(56) References Cited

U.S. PATENT DOCUMENTS 4,912,065 A    3/1990    Mizuno et al.
(Continued)

FOREIGN PATENT DOCUMENTS

| JP | 6-342698 | 12/1994 |
|---|---|---|
| JP | 2718926 | 11/1997 |
| JP | 2001-284322 | 10/2001 |

(Continued)

OTHER PUBLICATIONS

Sasaki, Y., et al., "$B_2H_6$ Plasma Doping with "In-situ He Pre-amorphization"", 2004, Symposia on VLSI Technology and Circuits.

*Primary Examiner*—Savitri Mulpuri
*Assistant Examiner*—Mohsen Ahmadi
(74) *Attorney, Agent, or Firm*—McDermott Will & Emery LLP

(57) ABSTRACT

A method and an apparatus for plasma processing which can accurately monitor an ion current applied to the surface of a sample. Predetermined gas is exhausted via an exhaust port by a turbo-molecular pump while introducing the gas within the vacuum chamber from a gas supply device, and the pressure within the vacuum chamber is kept at a predetermined value by a pressure regulating valve. A high-frequency power supply for a plasma source supplies a high-frequency power to a coil provided near a dielectric window to generate inductively coupled plasma within the vacuum chamber. A high-frequency power supply for the sample electrode for supplying the high-frequency power to the sample electrode is provided. A matching circuit for the sample electrode and a high-frequency sensor are provided between the sample electrode high-frequency power supply and the sample electrode. An ion current applied to the surface of a sample can be accurately monitored buy using the high-frequency sensor and an arithmetic device.

23 Claims, 8 Drawing Sheets

U.S. PATENT DOCUMENTS

| | | |
|---|---|---|
| 6,182,604 B1 | 2/2001 | Goeckner et al. |
| 6,500,496 B1 | 12/2002 | Goeckner et al. |
| 2002/0104832 A1 | 8/2002 | Tanaka et al. |
| 2002/0153349 A1* | 10/2002 | Okumura et al. .............. 216/57 |
| 2003/0192864 A1 | 10/2003 | Tanaka et al. |
| 2004/0045669 A1* | 3/2004 | Okumura et al. ....... 156/345.35 |
| 2005/0098116 A1* | 5/2005 | Yamagishi et al. .......... 118/722 |

FOREIGN PATENT DOCUMENTS

| | | |
|---|---|---|
| JP | 2002-100611 | 4/2002 |
| JP | 2003-513439 | 4/2003 |
| JP | 2003-513441 | 4/2003 |
| JP | 2003-515945 | 5/2003 |
| WO | WO 01/31681 A1 | 5/2001 |
| WO | WO 01/41183 A1 | 6/2001 |

* cited by examiner

METHOD AND APPARATUS FOR PLASMA PROCESSING

RELATED APPLICATIONS

This application is the U.S. National Phase under 35 U.S.C. § 371 of International Application No. PCT/JP2006/307126, filed on Apr. 4, 2006, which in turn claims the benefit of Japanese Application No. 2005-107775, filed on Apr. 4, 2005, the disclosures of which Applications are incorporated by reference herein.

TECHNICAL FIELD

The present invention relates to a method for plasma processing and, in particular, relates to a method and an apparatus for plasma doping which introduces impurities into the surface of a solid sample such as a semiconductor substrate.

BACKGROUND ART

As a technique of introducing impurities into the surface of a solid sample, there is known a plasma doping method that ionizes impurities to introduce into a solid at a low energy (see a patent document 1, for example). FIG. 8 shows the schematic configuration of a plasma processing apparatus used in the plasma doping method as the impurity introducing method of the related art described in the patent document 1. In FIG. 8, a sample electrode 6 for placing a sample 9 configured by a silicon substrate thereon is provided in a vacuum chamber 1. A gas supply device 2 for supplying gas as doping material containing a desired element such as B2H6 within the vacuum chamber 1 is provided and further a turbo-molecular pump 3 for reducing the pressure within the vacuum chamber 1 is provided, whereby the pressure within the vacuum chamber 1 can be kept at a predetermined value. Microwave is irradiated within the vacuum chamber 1 from a microwave guide 41 via a quartz plate 42 serving as a dielectric window. Due to the mutual action between the microwave and a DC (direct-current) magnetic field formed by an electromagnet 43, magnetic field microwave plasma (electron cyclotron resonance plasma) 44 is formed within the vacuum chamber 1. A high-frequency power supply 10 is coupled to the sample electrode 6 via a capacitor 45 so as to control the voltage of the sample electrode 6. The gas supplied from the gas supply device 2 is introduced within the vacuum chamber 1 from a gas introduction port 46 and exhausted to the turbo-molecular pump 3 from an exhaust port 11.

In the plasma processing apparatus thus configured, the doping material gas, for example, $B_2H_6$ introduced from the gas introduction port 46 is converted into plasma by a plasma generating means configured by the microwave guide 41 and the electromagnet 43, and boron ions within the plasma 44 are introduced in the surface of the sample 9 by the high-frequency power supply 10.

In the method and apparatus for plasma doping, a method of measuring a high-frequency current to be supplied to the sample electrode is proposed as a method of controlling a doping quantity. FIG. 9 shows the schematic configuration of an example of an apparatus for realizing such a method. In FIG. 9, the sample electrode 6 for placing the sample 9 configured by the silicon substrate thereon is provided in the vacuum chamber 1. The gas supply device 2 for supplying doping gas containing a desired element such as B2H6 within the vacuum chamber 1 is provided and further the turbo-molecular pump 3 for reducing the pressure within the vacuum chamber 1 is provided, whereby the pressure within the vacuum chamber 1 can be kept at the predetermined value.

Since a high-frequency power is supplied from the power supply 10 to the sample electrode 6 via the capacitor 45 and a high-frequency current transformer 47, plasma is formed within the vacuum chamber 1 and boron ions within the plasma are introduced in the surface of the sample 9. The density of boron thus doped can be controlled by measuring a high-frequency current at the time of discharge by using an ampere meter 48 via the high-frequency current transformer 47. A counter electrode 30 is provided so as to oppose to the sample electrode and the counter electrode 30 is grounded (see a patent document 2, for example).

As another method of controlling a doping quantity a method using Faraday cups is proposed. FIG. 10 shows the schematic configuration of an example of an apparatus for realizing such a method. In FIG. 10, a plasma chamber 49 defines a volume 50 surrounded thereby. A platen 51 disposed within the chamber 49 provides a surface for holding a work piece such as a semiconductor wafer 52 thereon. For example, the wafer 52 is placed on the flat surface of the platen 51 and the peripheral edge of the wafer is clamped by the platen. The platen 51 supports the wafer 52 and provides an electric coupling to the wafer 52. An anode 53 is disposed within the chamber 49 so as to be spaced from the platen 51. The anode 53 is movable in a direction shown by an arrow 54 vertically with respect to the platen 51. Typically, the anode 53 is coupled to the electrically conductive wall of the chamber 49, and both the anode and the wall are grounded. Each of the wafer 52 and the anode 53 is coupled to a high-voltage generator 55 and so the wafer 52 acts as a cathode. Typically, the pulse generator 55 supplies pulses having a voltage range almost from 100 to 500 volt, an interval in a rang almost from 1 to 50 micro second, and a repetition rate in a range almost from 100 to 2 kHz. The volume 50 surrounded by the chamber 49 is coupled to a vacuum pump 57 via a controllable valve 56. A gas source 58 is coupled to the chamber 49 via a mass flow-rate controller 59. A pressure sensor 60 disposed within the chamber 49 supplies a signal representing a pressure within the chamber to a controller 61. The controller 61 compares the detected pressure within the chamber with an inputted desired pressure to apply a control signal to the valve 56. The control signal controls the valve 56 so as to minimize a difference between the pressure within the chamber and the desired pressure. The vacuum pump 57, valve 56, pressure sensor 60 and controller 61 constitute a closed-loop pressure control system. Typically, although the pressure is controlled in a range almost from 1 mTorr to 500 mTorr, the pressure range is not limited to this range. The gas source 58 supplies ionizable gas containing desired dopant to be doped within the work piece. Examples of the ionizable gas are $BF_3$, $N_2$, Ar, $PF_5$ and $B_2H_6$. The mass flow-rate controller 59 adjusts a flow rate when the gas is supplied to the chamber 49. The configuration of FIG. 10 provides a continuous flow of process gas with a constant gas flow rate and a constant pressure. The pressure and the gas flow rate are adjusted preferably so as to provide repeatable results.

Upon operation, the wafer 52 is placed on the platen 51. Thereafter, the pressure control system, the mass flow-rate controller 59 and the gas source 58 generate the gas flow of the desired pressure and flow rate. As an example, the chamber 49 operates with $BF_3$ gas at the pressure of 10 mTorr. The pulse generator 55 applies high-voltage pulses continuously to the wafer 52 to form plasma 62 between the wafer 52 and the anode 53. As known as a well-known technique, the plasma 62 contains positive ions of ionizable gas supplied from the gas source 58. The plasma 62 further contains a plasma sheath 63 near the platen 51. During the high-voltage pulse, the magnetic field existing between the anode 53 and the platen 51 accelerates the positive ions so as to move toward the platen 51 from the plasma 62 across the plasma sheath 63. The accelerated ions are implanted within the wafer 52 so as to form a region of impurity material. The pulse voltage is selected so as to implant the positive ions at a desired depth within the wafer 52. The number and interval of pulses are selected so as to provide the impurity material of a desired dose amount to the wafer 52. A current per single pulse is a function of the pulse voltage, the gas pressure, species and the movable position of the electrode. For example, the distance between the cathode and the anode can be adjusted with respect to different voltages.

At least one Faraday cup is disposed adjacent to the platen 51 in order to measure the dose amount of the ions implanted into the wafer 52. In FIG. 10, Faraday cups 64 and 65 are disposed at the peripheral portions of the outer periphery of the wafer 52 with the same interval therebetween. Each of the Faraday cups is formed by a conductive enclosure having an inlet 66 facing on the plasma 62. Preferably, each of the Faraday cups is disposed near the wafer 52 as close as possible actually so as to shield samples of the positive ions accelerated toward the platen 51 from the plasma 62. The Faraday cups are electrically coupled to a dose amount processor or another dose amount monitoring circuit. As known as a well-known technique, the positive ions entered into the Faraday cups via the inlet 66 generates a current within the electric circuit coupled to the Faraday cups. The current represents the number of the positive ions received per a unit time, that is, an ion current. The ion current received by the Faraday cups 64 and 65 is supposed to have a constant relation to the number of ions implanted into the wafer 52. Depending on the uniformity of the plasma 62 and the uniformity of the acceleration of the ions toward the platen 51, the ion current per a unit area received by each of the Faraday cups is substantially equal to the ion current per a unit area implanted into the wafer 52 or a constant part thereof. Since an output current from each of the Faraday cups represents the ion current implanted into the wafer 52, each of the Faraday cups 64 and 65 provides the measurement result of the ion dose amount implanted into the wafer 52. The Faraday cups 64 and 65 may be disposed within a guard ring 67 in the vicinity of the wafer 52 and the platen 51. The electric current representing the ion current is supplied to the dose amount processor 68 from the Faraday cups (see a patent document 3, for example).

As a still another method of controlling the doping quantity, there is proposed a method for reducing a capacitor current corresponding to a displacement current from the current supplied to the sample electrode. In FIG. 11, the plasma doping chamber defines a sealed volume 50. A platen 51 disposed within a chamber 49 provides a surface for holding a substrate to be processed such as a semiconductors wafer 52. The semiconductors wafer is a mere example of types capable of being a target.

For example, the implantation may be made into metal for a tool, a part for an automobile, a stamp die or plastics. For example, the wafer 52 is fastened against the flat surface of the platen 51 at the periphery thereof. The platen 51 supports the wafer 52 and provides an electric coupling to the wafer 52. An anode 53 is disposed within the chamber 49 so as to be spaced from the platen (cathode) 51. The anode 53 is movable in a direction shown by an arrow 54 vertically with respect to the platen 51. Typically, the anode 53 is coupled to the electrically conductive wall of the chamber 49, and both the anode and the wall are grounded.

Thus, each of the cathode 51 and the wafer 52 is coupled to a high-voltage generator 55. Typically, the pulse generator 55 supplies pulses having a voltage range almost from 100 to 10,000 volt and a time interval in a rang almost from 1 to 100 micro second at a repetition rate in a range almost from 50 to 5 kHz. The sealed volume 50 of the chamber 49 is coupled to a vacuum pump 57 via a controllable valve 56. A gas source 58 is coupled to the chamber 49 via a mass flow-rate controller 59. A pressure sensor 60 disposed within the chamber 49 supplies a signal representing a pressure within the chamber to a controller 61. The controller 61 compares the detected pressure within the chamber with an inputted desired pressure to apply a control signal to the valve 56. The control signal controls the valve 56 so as to minimize a difference between the pressure within the chamber and the desired pressure. The vacuum pump 57, valve 56, pressure sensor 60 and controller 61 constitute a closed-loop pressure control apparatus.

Typically, although the pressure is controlled in a range almost from 1 mTorr to 500 mTorr, the pressure range is not limited to this range. The gas source 58 supplies ionizable gas containing desired dopant to be doped within the substrate to be processed. Examples of the ionizable gas are $BF_3$, $N_2$, Ar, $PF_5$ and $B_2H_6$. The mass flow-rate controller 59 adjusts a speed of the gas to be supplied to the chamber 49. The configuration of FIG. 11 provides a continuous flow of process gas with a constant gas flow rate and a constant pressure. The pressure and the gas flow rate are adjusted preferably so as to provide repeatable results.

During the operation, the wafer 52 is placed on the platen 51. Thereafter, the pressure control system, the mass flow-rate controller 59 and the gas source 58 are set so as to generate the gas flow of the desired pressure and flow rate. As an example, the chamber 49 operates with $BF_3$ gas at the pressure of 10 mTorr. The pulse generator 55 applies high-voltage pulses continuously to the wafer 52 to form plasma 62 between the wafer 52 and the anode 53. As known as a well-known technique, the plasma 62 contains positive ions of ionizable gas supplied from the gas source 58. Further, the plasma 62 contains a plasma sheath 63 near the platen 51. During the high-voltage pulse, the magnetic field existing between the anode 53 and the platen 51 accelerates the positive ions so as to move toward the platen 51 from the plasma 62 across the plasma sheath 63. On the contrary, secondary electrons that are generated by the ion collision on the platen 51 and the wafer 52 are accelerated into the plasma across the plasma sheath 63. The accelerated ions are implanted within the wafer 52 so as to form a region of impurity material. The pulse voltage is selected so as to implant the positive ions at a desired depth within the wafer 52. The number and interval of pulses are selected so as to provide the impurity material (positive ions) of a desired dose amount within the wafer 52. A current per single pulse is a function of the pulse voltage, the gas pressure, gas species and the position of the electrode. For example, the distance between the cathode and the anode can be adjusted with respect to different voltages.

In the plasma doping apparatus, the pulse current is measured in order to provide a pulse current signal representing an ion current to be distributed to the wafer. The pulse current flowing into the plasma doping apparatus is a sum of the ion current, a secondary electron current and a displacement current. A compensation signal representing the displacement current component of the pulse current is generated. The compensation signal is subtracted from the pulse current signal so as to provide an ion current signal representing the ion current to be distributed to the wafer. To this end, a secondary capacitor is used which preferably has the same or almost same capacitance as that of a primary capacitor constituted by the wall of the chamber and the electrodes of the plasma doping apparatus including the anode and the cathode. When the same or similar voltage pulse is applied to the secondary capacitor, a secondary displacement current is generated which is the same as or quite similar to a primary displacement current generated in the primary capacitor. As described above, the primary current is the sum of the ion current, the secondary electron current and the primary displacement current. Thus, the ion current and the secondary electron current can be measured accurately by subtracting the secondary displacement current (substantially same as the primary displacement current) from the primary current. The secondary capacitor is a variable capacitor which capacitance varies so as to coincide with the capacitance of the plasma doping apparatus.

As shown in FIG. 11, it is considered that a complete anode construction configured by the anode 53 and the wall of the chamber 49 and the platen (cathode) 51 of the plasma doping apparatus constitutes the primary capacitance C1. Preferably, the secondary capacitor C2 is selected so as to have the same or similar capacitance as that of the primary capacitance C1. The primary capacitance C1 and the secondary capacitor C2 are coupled in parallel to each other, effectively.

As clear from this figure, the high voltage pulses from the pulse source 55 are applied to both the capacitors C1 and C2. A first current measurement device 69 is provided so as to measure a current flowing into the primary capacitance C1 and to output the measured value to a dose processor 68. A second current measurement device 70 is provided so as to measure a current flowing into the secondary capacitance C2. The output of the current measurement device 70 is also applied to the dose processor 68. The current measurement devices 69 and 70 are the same type of devices or different types of devices. Pearson coils are used in order to measure the currents flowing into the respective capacitors during the pulse.

However, at present, many different types of current measurement devices can be utilized. One of these different types of current measurement devices is used to measure the currents. During the operation, when the pulse is applied to the two capacitors, the primary current is generated in the primary capacitance C1, and a secondary displacement current which is substantially same as or quite similar to the primary displacement current component of the primary current is generated in the secondary capacitor C2. The ion current and the secondary electron current being distributed to the target can be measured accurately by subtracting the secondary displacement current from the primary current. The accurate measurement of these currents provides better process control and repetitive property (see a patent document 4, for example).

In the case of forming a MOS transistor, for example, prior to the introduction of impurities, a thin oxide film is formed on the surface of a sample within a predetermined oxidizing atmosphere, and then a gate electrode is formed by utilizing such a CVD apparatus. Then, the MOS transistor is obtained by introducing the impurities by using the gate electrode as a mask. However, since a transistor can no be constituted by merely introducing the impurities by the plasma doping processing, it is required to perform an activating processing. The activating processing is to heat and recrystallize a layer in which impurities is introduced by using methods such as a laser annealing or a flash lamp annealing. In this case, a shallow activation layer can be obtained by effectively heating a quite thin layer in which impurities is introduced. In order to effectively heat the quite thin layer in which impurities is introduced, prior to the introduction of the impurities, a processing is performed in advance as to the quite thin layer in which the impurities is to be introduced in order to increase the absorption rate of light irradiated from a light source such as a laser or a lamp. This processing is called as a pre-amorphization. The pre-amorphization is performed in a manner that in a plasma processing apparatus having the similar configuration as that of the aforesaid plasma processing apparatus, plasma such as He gas is generated, and then ions such as the generated He ions are accelerated by a bias voltage toward a substrate and collided against the substrate to break the crystal structure of the surface of the substrate to amorphize. This processing has been proposed by the inventors of this application etc. (See a Non-patent document 1, for example).

Patent document 1: U.S. Pat. No. 4,912,065
Patent document 2: Japanese Patent No. 2,718,926
Patent document 3: JP2003-T-515945
Patent document 4: JP2004-T-513439
Non-patent document 1: Y Sasaki et al., "$B_2H_6$ Plasma Doping with In-situ He Pre-amorphyzation", 2004, Symposia on VLSI Technology and Circuits

DISCLOSURE OF THE INVENTION

Problems that the Invention is to Solve

However, according to the methods of the related art, there arises a problem that, when the magnitude of the high-frequency or pulse power is changed in order to control the high-frequency current, each of the electron density, the boron ion density in the plasma and energy of the ions arriving at the substrate changes and so the controllability is degraded.

According to the method of the related art shown in the patent document 3, since the ion detection sensitivity changes due to a fact that the surface state of the Faraday cup changes with time, there arises a problem that the impurity density can not be controlled accurately.

Further, according to the method of the related art shown in the patent document 4, there is a problem that it is not easy to coincide the static capacities of the capacitors C1 and C2. Even if they are made coincide, it is not easy to coincide the series resistance values of the capacitors C1 and C2 which are an important element to determine time constants in the process where the capacitors C1 and C2 are charged. Even if the capacitors C1 and C2 are made coincide, there arises a problem that the impurity density can not be controlled accurately since a charge current may differ depending on a pulse width. Further, there is a problem that the configuration of the apparatus is complicated since the two current sensors are required.

In the amorphizing processing using He plasma, there has not been proposed a method of accurately controlling the thickness of an amorphous layer formed on the surface of a sample.

The invention has been made in view of the aforesaid circumstances and an object of the invention is to provide a method and an apparatus for plasma processing which can accurately monitor an ion current applied to the surface of a sample and, in particular, to provide a method and an apparatus for plasma processing which are excellent in the controllability of the density of impurities introduced into the surface of a sample and the controllability of the thickness of an amorphous layer.

Means for Solving the Problems

The plasma processing method according to the invention is a plasma processing method in which a sample is placed on a sample electrode within a vacuum chamber, then gas within the vacuum chamber is exhausted while supplying the gas within the vacuum chamber from a gas supply device, and a high-frequency power is supplied to the sample electrode via a matching circuit for the sample electrode while controlling a pressure within the vacuum chamber to a predetermined value thereby to generate plasma within the vacuum chamber, thereby accelerating ions in the plasma toward a surface of the sample to collide with the surface to process the sample, characterized by including:

a step of supplying a high-frequency voltage to the sample electrode under a condition of not generating the plasma to measure a high-frequency voltage $V0$ and a current $I0$ supplied to the sample electrode by a high-frequency sensor provided between the sample electrode matching circuit and the sample electrode;

a step of measuring a high-frequency voltage $V1$ and a current $I1$ supplied to the sample electrode by the high-frequency sensor when the plasma is generated to subject the sample to a plasma processing;

a step of obtaining a substantial high-frequency current based on charged particles movement flowing into the sample electrode as $Ir=I1-I0 \cdot V1/V0$; and a step of controlling a processing condition based on Ir thus obtained.

According to this configuration, it is possible to provide the plasma processing method which can accurately monitor an ion current applied to the surface of a sample and, in particular, to provide the plasma processing method which is excellent in the controllability of the density of impurities introduced into the surface of a sample and the controllability of the thickness of an amorphous layer. Further, since the depth at which the impurities is introduced can be controlled in accordance with the depth of the amorphous layer, the depth of an area where the impurities is introduced can be controlled with a high-accuracy. The controlled processing condition will be explained later.

The plasma processing method according to the invention is a plasma processing method in which a sample is placed on a sample electrode within a vacuum chamber, then gas within the vacuum chamber is exhausted while supplying the gas within the vacuum chamber from a gas supply device, and a high-frequency power is supplied to the sample electrode via a matching circuit for the sample electrode while controlling a pressure within the vacuum chamber to a predetermined value thereby to generate plasma within the vacuum chamber, thereby accelerating ions in the plasma toward a surface of the sample to collide with the surface to process the sample, characterized by including:

a step of supplying a high-frequency voltage to the sample electrode under a condition of not generating the plasma to measure a high-frequency voltage $V0$ and a current $I0$ supplied to the sample electrode by a high-frequency sensor provided between the sample electrode matching circuit and the sample electrode;

a step of measuring a high-frequency voltage $V1$ and a current $I1$ supplied to the sample electrode by the high-frequency sensor when the plasma is generated to subject the sample to a plasma processing;

a step of obtaining a substantial high-frequency current based on charged particles movement flowing into the sample electrode as $Ir=I1-I0 \cdot V1/V0$; and a step of controlling a processing condition so that Ir becomes a predetermined value.

According to this configuration, it is possible to provide the plasma processing method which can accurately monitor an ion current applied to the surface of a sample and, in particular, to provide the plasma processing method which is excellent in the controllability of the density of impurities introduced into the surface of a sample and the controllability of the thickness of an amorphous layer.

The plasma processing method according to the invention is a plasma processing method in which a sample is placed on a sample electrode within a vacuum chamber, then gas within the vacuum chamber is exhausted while supplying the gas within the vacuum chamber from a gas supply device, and a high-frequency power is supplied to a plasma source to generate the plasma within the vacuum chamber and also the high-frequency power is supplied to the sample electrode via a matching circuit for the sample electrode while controlling a pressure within the vacuum chamber to a predetermined value thereby to accelerating ions in the plasma toward a surface of the sample to collide with the surface to process the sample, characterized by including:

a step of supplying a high-frequency voltage to the sample electrode under a condition of not generating the plasma to measure a high-frequency voltage $V0$ and a current $I0$ supplied to the sample electrode by a high-frequency sensor provided between the sample electrode matching circuit and the sample electrode;

a step of measuring a high-frequency voltage $V1$ and a current $I1$ supplied to the sample electrode by the high-frequency sensor when the plasma is generated to subject the sample to a plasma processing;

a step of obtaining a substantial high-frequency current based on charged particles movement flowing into the sample electrode as $Ir=I1-I0 \cdot V1/V0$; and a step of controlling a processing condition so that Ir becomes a predetermined value.

According to this configuration, it is possible to provide the plasma processing method which can accurately monitor an ion current applied to the surface of a sample and, in particular, to provide the plasma processing method which is excellent in the controllability of the density of impurities introduced into the surface of a sample and the controllability of the thickness of an amorphous layer.

In the plasma processing method according to the invention, preferably, in the step of controlling the processing condition so that Ir becomes a predetermined value, it is desirable to change the high-frequency power supplied to the sample electrode so that Ir becomes the predetermined value. Alternatively, a predetermined gas flow rate may be changed or the high-frequency power supplied to the plasma source may be changed.

According to this configuration, it is possible to realize simple process controllability.

The plasma processing method according to the invention is a plasma processing method in which a sample is placed on a sample electrode within a vacuum chamber, then gas within the vacuum chamber is exhausted while supplying the gas within the vacuum chamber from a gas supply device, and a high-frequency power is supplied to the sample electrode via a matching circuit for the sample electrode while controlling a pressure within the vacuum chamber to a predetermined value thereby to generate plasma within the vacuum chamber, thereby accelerating ions in the plasma toward a surface of the sample to collide with the surface to process the sample, characterized by including:

a step of supplying a high-frequency voltage to the sample electrode under a condition of not generating the plasma to measure a high-frequency voltage $V0$ and a current $I0$ supplied to the sample electrode by a high-frequency sensor provided between the sample electrode matching circuit and the sample electrode;

a step of measuring a high-frequency voltage V1 and a current I1 supplied to the sample electrode by the high-frequency sensor when the plasma is generated to subject the sample to a plasma processing;

a step of obtaining a substantial high-frequency current based on charged particles movement flowing into the sample electrode as $Ir=I1-I0\cdot V1/V0$; and a step of terminating the processing when a value obtained by time-integrating Ir during processing of the sample reaches a predetermined value.

According to this configuration, it is possible to provide the plasma processing method which can accurately monitor an ion current applied to the surface of a sample and, in particular, to provide the plasma processing method which is excellent in the controllability of the density of impurities introduced into the surface of a sample and the controllability of the thickness of an amorphous layer.

The plasma processing method according to the invention is a plasma processing method in which a sample is placed on a sample electrode within a vacuum chamber, then gas within the vacuum chamber is exhausted while supplying the gas within the vacuum chamber from a gas supply device, and a high-frequency power is supplied to a plasma source to generate the plasma within the vacuum chamber and also the high-frequency power is supplied to the sample electrode via a matching circuit for the sample electrode while controlling a pressure within the vacuum chamber to a predetermined value thereby to accelerating ions in the plasma toward a surface of the sample to collide with the surface to process the sample, characterized by including:

a step of supplying a high-frequency voltage to the sample electrode under a condition of not generating the plasma to measure a high-frequency voltage V0 and a current I0 supplied to the sample electrode by a high-frequency sensor provided between the sample electrode matching circuit and the sample electrode;

a step of measuring a high-frequency voltage V1 and a current I1 supplied to the sample electrode by the high-frequency sensor when the plasma is generated to subject the sample to a plasma processing;

a step of obtaining a substantial high-frequency current based on charged particles movement flowing into the sample electrode as $Ir=I1-I0\cdot V1/V0$; and a step of terminating the processing when a value obtained by time-integrating Ir during processing of the sample reaches a predetermined value.

According to this configuration, it is possible to provide the plasma processing method which can accurately monitor an ion current applied to the surface of a sample and, in particular, to provide the plasma processing method which is excellent in the controllability of the density of impurities introduced into the surface of a sample and the controllability of the thickness of an amorphous layer.

The plasma processing method according to the invention is quite effective when the plasma processing method is a plasma doping method of introducing impurities in the surface of the sample, and it is possible to provide the plasma processing method which is excellent in the controllability of the density of impurities introduced into the surface of a sample and the controllability of the thickness of an amorphous layer.

In the plasma processing method according to the invention, preferably, the step of measuring V0 and I0 is desirably a step of measuring them preliminarily by using another dummy sample in place of the sample. According to this configuration, even if the plasma is generated erroneously in the step of measuring V0 and I0 where the plasma is never generated primarily, it is possible to prevent the sample from being damaged.

Further, preferably, the step of measuring V0, I0, V1 and I1 desirably includes a step of sampling a voltage and a current to obtain waveforms, and a step of subjecting high-frequency voltage waveform and current waveform thus measured to a Fourier transformation to divide into fundamental waveform components V01, I01, V1, I11 and harmonics waveform components V0n, I0n, V1n, I1n (n is 2, 3,—and represents n-th harmonics) to obtain Ir as $Ir=\Sigma(I1n-I0n\cdot V1n/V0n)$ ($\Sigma$ represents to add n which is 1 or more).

Alternatively, the step of measuring V0, I0, V1 and I1 may include a step of sampling a voltage and a current to obtain waveforms, and a step of subjecting high-frequency voltage waveform and current waveform thus measured to a Fourier transformation to divide into fundamental waveform components V01, I01, V11, I11 and harmonics waveform components V0n, I0n, V1n, I1n (n is 2, 3,—and represents n-th harmonics) to obtain Ir as $Ir=I11-I01\cdot V11/V01+\Sigma I1n$ ($\Sigma$ represents to add n which is 2 or more).

According to this configuration, it is possible to provide the plasma processing method that can more accurately monitor an ion current applied to the surface of a sample.

Further, in this case, preferably, the sampling frequency is a frequency sufficient for measuring a third harmonics of the fundamental frequency of the high-frequency voltage supplied to the sample electrode, and it is desirable to consider at least up to the third harmonics at a time of obtaining Ir. More preferably, the sampling frequency is a frequency sufficient for measuring a fifth harmonics of the fundamental frequency of the high-frequency voltage supplied to the sample electrode, and it is desirable to consider at least up to the fifth harmonics at a time of obtaining Ir.

According to this configuration, it is possible to provide the plasma processing method that can more accurately monitor an ion current applied to the surface of a sample.

The plasma processing apparatus according to the invention includes: a vacuum chamber; a sample electrode; a gas supply device which supplies gas within the vacuum chamber; an exhaust device which exhausts the gas within the vacuum chamber; a pressure control device which controls a pressure within the vacuum chamber; a high-frequency power supply for the sample electrode which supplies high-frequency power to the sample electrode; a matching circuit for the sample electrode which performs impedance matching of the sample electrode; a high-frequency sensor which is provided between the sample electrode matching circuit and the sample electrode; and an arithmetic device which calculates, based on measurement values of the high-frequency sensor, a substantial high-frequency current based on charged particles movement flowing into the sample electrode.

According to this configuration, it is possible to provide the plasma processing apparatus which can accurately monitor an ion current applied to the surface of a sample and, in particular, to provide the plasma processing apparatus which is excellent in the controllability of the density of impurities introduced into the surface of a sample and the controllability of the thickness of an amorphous layer.

The plasma processing apparatus according to the invention includes: a vacuum chamber; a sample electrode; a gas supply device which supplies gas within the vacuum chamber; an exhaust device which exhausts the gas within the vacuum chamber; a pressure control device which controls a pressure within the vacuum chamber; a plasma source; a high-frequency power supply for the plasma source which supplies a high-frequency power to the plasma source; a high-frequency power supply for the sample electrode which supplies high-frequency power to the sample electrode; a matching circuit for the sample electrode which performs impedance matching of the sample electrode; a high-frequency sensor which is provided between the sample electrode matching circuit and the sample electrode; and an arithmetic device which calculates, based on measurement values of the high-frequency sensor, a substantial high-frequency current based on charged particles movement flowing into the sample electrode.

According to this configuration, it is possible to provide the plasma processing apparatus which can accurately monitor an ion current applied to the surface of a sample and, in particular, to provide the plasma processing apparatus which is excellent in the controllability of the density of impurities introduced into the surface of a sample and the controllability of the thickness of an amorphous layer.

In the plasma processing apparatus according to the invention, preferably, the high-frequency sensor desirably includes a sampling portion which samples voltage and current, and the arithmetic part includes a dividing part which subjects the measured high-frequency voltage waveform and current waveform to Fourier transformation to divide into fundamental waveform components $V01$, $I01$, $V11$, $I11$ and harmonics waveform components $V0n$, $I0n$, $V1n$, $I1n$ (n is 2, 3,—and represents n-th harmonics), and a summing part which obtains a substantial high-frequency current Ir based on charged particles movement flowing into the sample electrode as $Ir=\Sigma(I1n-I0n\cdot V1n/V0n)$ ($\Sigma$ represents to add n which is 1 or more). Alternatively, the high-frequency sensor may be configured to include a sampling portion which samples voltage and current, and the arithmetic part includes a dividing part which subjects the measured high-frequency voltage waveform and current waveform to Fourier transformation to divide into fundamental waveform components $V01$, $I01$, $V11$, $I11$ and harmonics waveform components $V0n$, $I0n$, $V1n$, $I1n$ (n is 2, 3,—and represents n-th harmonics), and a summing part which obtains a substantial high-frequency current Ir based on charged particles movement flowing into the sample electrode as $Ir=I11-I01\cdot V11/V01+\Sigma I1n$ ($\Sigma$ represents to add n which is 2 or more).

According to this configuration, it is possible to provide the plasma processing apparatus that can accurately monitor an ion current applied to the surface of a sample.

In this case, preferably, the sampling frequency is a frequency sufficient for measuring a third harmonics of the fundamental frequency of the high-frequency voltage supplied to the sample electrode, and it is desirable to consider at least up to the third harmonics at a time of obtaining Ir. More preferably, the sampling frequency is a frequency sufficient for measuring a fifth harmonics of the fundamental frequency of the high-frequency voltage supplied to the sample electrode, and it is desirable to consider at least up to the fifth harmonics at a time of obtaining Ir.

According to this configuration, it is possible to provide the plasma processing apparatus that can more accurately monitor an ion current applied to the surface of a sample.

In the invention, the substantial high-frequency current based on the charged particles movement flowing into the sample electrode is obtained as $Ir=I1-I0\cdot V1/V0$, then the high-frequency current is controlled so as to be the predetermined value while the sample is processed, and the processing is terminated when a value obtained by time-integrating Ir during the processing of the sample reaches the predetermined value, whereby it is possible to perform a more accurate control.

EFFECTS OF THE INVENTION

As described above, according to the method and apparatus for plasma processing of the invention, it is possible to provide a method and an apparatus for plasma processing which can accurately monitor an ion current applied to the surface of a sample and, in particular, to provide a method and an apparatus for plasma processing which are excellent in the controllability of the density of impurities introduced into the surface of a sample and the controllability of the thickness of an amorphous layer.

Figure 1:
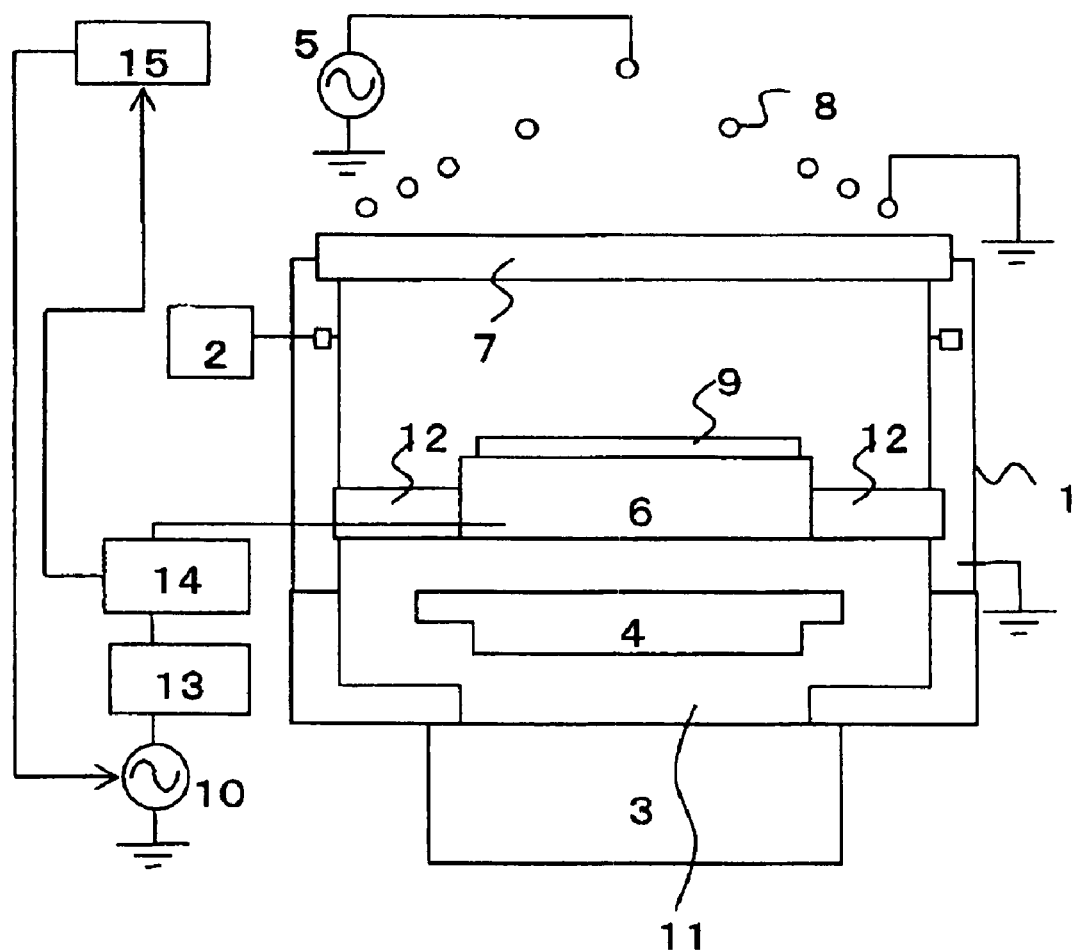
FIG. 1 is a sectional diagram showing the configuration of a plasma processing apparatus used in the first embodiment of the invention.

DESCRIPTION OF THE REFERENCE NUMERALS 1 vacuum chamber
2 gas supply device
3 turbo-molecular pump
4 pressure regulating valve
5 high-frequency power supply for a plasma source
6 sample electrode
7 dielectric window
8 coil
9 substrate
10 high-frequency power supply for the sample electrode
11 exhaust port
12 pillar
13 matching circuit for sample electrode
14 high-frequency sensor
15 arithmetic device

BEST MODE FOR CARRYING OUT THE INVENTION

Hereinafter, an embodiment of the invention will be explained with reference to drawings.

FIRST EMBODIMENT

Hereinafter, the first embodiment of the invention will be explained with reference to FIGS. 1 to 6.

FIG. 1 is a sectional diagram showing a plasma processing apparatus used in the first embodiment of the invention. In FIG. 1, gas is exhausted from a chamber by a turbo-molecular pump 3 as an exhausting device while introducing the predetermined gas within the vacuum chamber 1 from a gas supply device 2, and the pressure within the vacuum chamber 1 can be kept at a predetermined value by a pressure regulating valve 4 serving as a pressure control device. A high-frequency power supply 5 for a plasma source supplies a high-frequency power of 13.56 MHz to a coil 8 (a sectional portion of the coil is shown in FIG. 1) provided near a dielectric window 7 opposing to a sample electrode 6, whereby inductively coupled plasma can be generated within the vacuum chamber 1. A silicon substrate 9 as a sample is placed on the sample electrode 6. Further a high-frequency power supply 10 for the sample electrode for supplying the high-frequency power to the sample electrode 6 is provided. This power supply functions as a voltage source for controlling the voltage of the sample electrode 6 so that the substrate 9 as the sample has a negative voltage with respect to the plasma. The gas within the vacuum chamber 1 is exhausted to the turbo-molecular pump 3 from an exhaust port 11. The sample electrode 6 is a pedestal of an almost square shape for placing the substrate 9 thereon. This electrode is fixed to the vacuum chamber 1 by pillars 12 at the respective sides of the electrode in a manner that the electrode is fixed to the vacuum chamber 1 by the four pillars 12 in total.

The high-frequency power supplied to the sample electrode 6 is supplied from the sample electrode high frequency power supply 10 via a matching circuit 13 for the sample electrode for performing the impedance matching with the sample electrode. A high-frequency sensor 14 is provided between the sample electrode matching circuit 13 and the sample electrode 6. An arithmetic device 15 is provided which calculates a substantial high-frequency current based on charged particles movement flowing into the sample electrode 6 on the basis of a measurement value of the high-frequency sensor 14. The arithmetic device 15 is configured so as to be able to control the output of the sample electrode high-frequency power supply 10 so that the substantial high-frequency current based on the charged particles movement flowing into the sample electrode 6 becomes a predetermined value.

Figure 2:
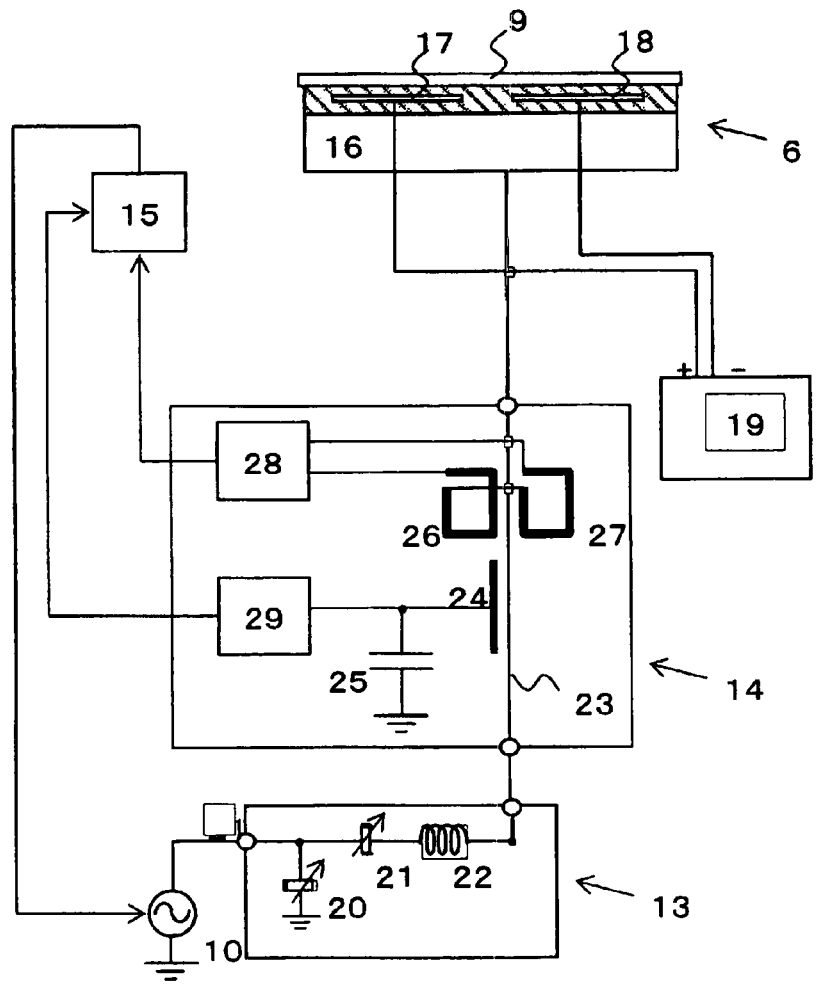
FIG. 2 is a diagram showing the detailed configuration of a sample electrode, a sample electrode matching circuit and a high-frequency sensor in the first embodiment of the invention.

FIG. 2 is a diagram showing the detailed configuration of the sample electrode 6, the sample electrode matching circuit 13 and the high-frequency sensor 14. In order to accurately control the temperature of the substrate by attracting the substrate 9 to the surface of the sample electrode 6, coolant such as water or Galden is flown to a pedestal 16 and high DC voltages with different polarities are applied to electrostatic chucking electrodes 17 and 18 from a DC power supply 19, respectively.

The sample electrode matching circuit 13 includes variable capacitors 20, 21 and a coil 22 and intends to perform impedance matching so that the impedance of the sample electrode matching circuit 13 seen toward the sample electrode side from the high-frequency input side thereof becomes equal to the characteristic impedance of a coupling cable for coupling the sample electrode high-frequency power supply 10 and the sample electrode matching circuit 13.

The high-frequency sensor 14 includes a high-frequency coupling line 23 through which the high-frequency power is supplied, a voltage sensor 24 for detecting the high-frequency voltage, a capacitor 25, current sensors 26 and 27 for detecting the high-frequency current, an ampere meter 28 and a voltmeter 29. The voltage sensor 24 is electrostatically coupled to the high-frequency coupling line 23 and passes a fine current according to a sum of a capacitance between the high-frequency coupling line 23 and the voltage sensor 24 and a capacitance of the capacitor 25 to a ground voltage portion via the capacitor 25. That is, a voltage proportional to the voltage of the high-frequency coupling line 23 can be led to the voltmeter 29 by suitably setting the capacitance between the high-frequency coupling line 23 and the voltage sensor 24 and the capacitance of the capacitor 25.

On the other hand, a voltage proportional to the high-frequency current flowing through the high-frequency coupling line 23 is generated at the current sensors 26 and 27 by the electromagnetic induction. As shown in FIG. 2, when the current sensors 26 and 27 are disposed so as to oppose to each other via the high-frequency coupling line 23 therebetween and are coupled in a manner that induction voltages generated from these current sensors have the same phase, an induction voltage based on disturbance other than the high-frequency current flowing through the high-frequency coupling line 23 can be cancelled and so the ampere meter 28 can measure the current with a high accuracy. Since each of the ampere meter 28 and the voltmeter 29 has a sampler part, the detected high-frequency current and high-frequency voltage are sampled at predetermined periods, then converted into digital data and sent to the arithmetic device 15, respectively.

Figure 3:
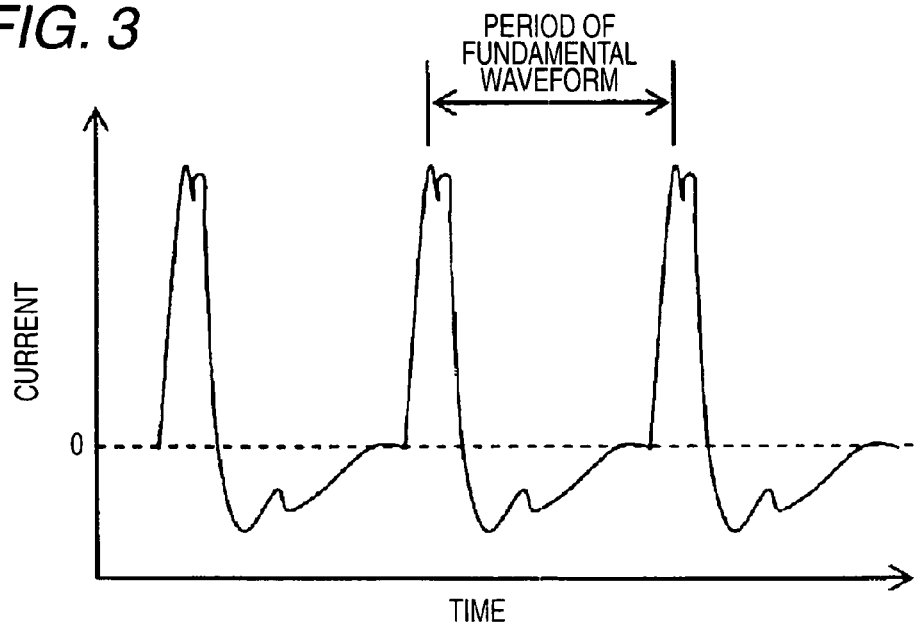
FIG. 3 is a diagram showing a high-frequency current waveform measured by a current sensor.

FIG. 3 shows an example of the high-frequency current waveform measured by the current sensor when the plasma is generated. Although large quantities of electrons and ions exist within the plasma, since a mass of the electron is quite smaller than that of the ion, a large quantity of the electrons are introduced into the solid surface quickly when the voltage of the solid surface contacting to the plasma is positive. On the other hand, since a mass of the ion is large, the speed of the ions is lower than that of the electron and only a small quantity of the ions are introduced into the solid surface. Thus, since the solid surface contacting to the plasma represents a strong non-linearity as the power load, even if driven by the sine wave voltage, the current waveform does not become a sine wave and deforms largely. In other words, this means that the high-frequency current flowing into the sample electrode contain many high-frequency component when the plasma is generated.

Figure 4:
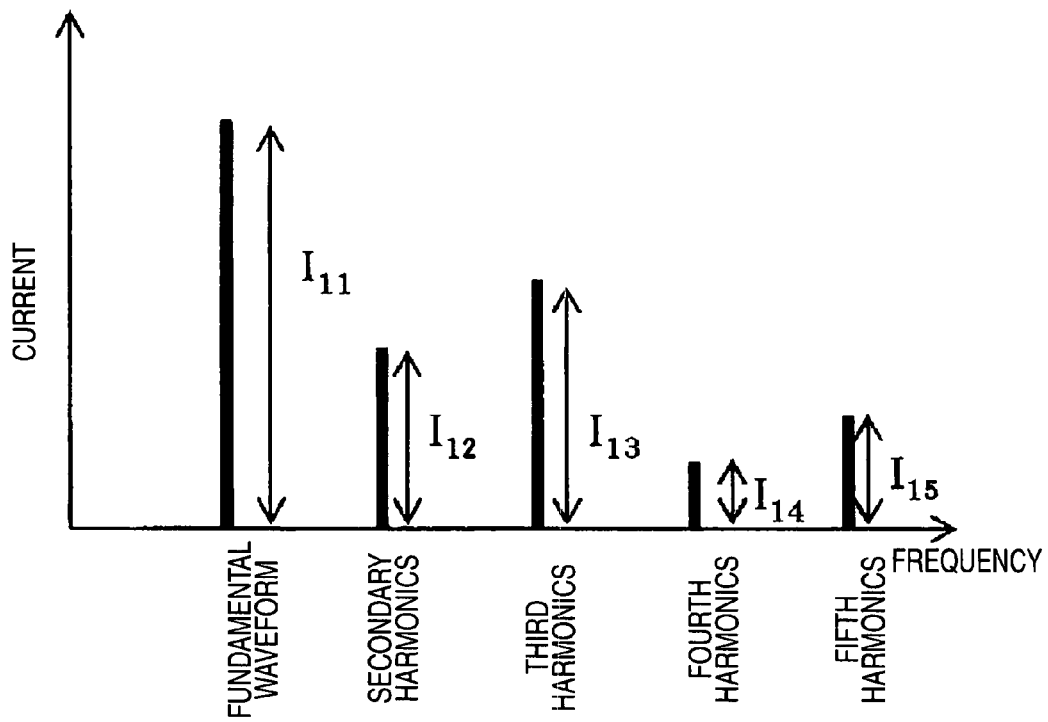
FIG. 4 is a diagram showing that the current waveform measured by the current sensor is subjected to Fourier transformation.

FIG. 4 is a diagram showing that the current waveform measured by the current sensor is subjected to Fourier transformation and divided into a fundamental waveform component I1 and harmonics waveform components I1n (n is 2, 3,—and represents n-th harmonics). In this case, the harmonics up to the fifth harmonics I15 are measured.

In this case, an attention must be paid to that the high-frequency current flowing into the sample electrode when the plasma is generated does not coincide with the substantial high-frequency current based on the charged particles movement flowing into the electrode (a current based on an electron current and an ion current flowing into the sample from the plasma). This is because a displacement current not based on the charged particles movement flows into capacitances exiting between the sample or the sample electrode and the vacuum chamber etc., and the high-frequency current measured by the current sensor becomes equal to a sum of the substantial current and the displacement current.

It is invented to separate the substantial current and the displacement current in a manner that the high-frequency voltage is supplied to the sample electrode under a condition that the plasma is not generated thereby to measure a high-frequency voltage V0 and a current I0 supplied to the sample electrode by the high-frequency sensor provided between the sample electrode matching circuit and the sample electrode and that the plasma is generated thereby to measure a high-frequency voltage V1 and a current I1 supplied to the sample electrode by the high-frequency sensor. That is, at the time of measuring V0, I0, V1, I1, the voltage and the current are sampled to obtain the waveforms thereof, then a dividing part provided at the arithmetic device 15 subjects the measured high-frequency voltage waveform and current waveform to the Fourier transformation and divide into fundamental waveform components V01, I01, V11, I11 and harmonics waveform components V0n, I0n, V1n, I1n (n is 2, 3,—and represents n-th harmonics), and a summing part provided at the arithmetic device can obtain a substantial high-frequency current Ir=Σ(I1n−I0n·V1n/V0n) (Σ represents to add n which is 1 or more). This is based on a concept that the predetermined frequency component of the displacement current when the plasma is generated is equal to a product of the predetermined frequency component of the current when the plasma is not generated by a ratio between the predetermined frequency component of the voltage when the plasma is generated and the predetermined frequency component of the voltage when the plasma is not generated.

In a step of measuring V0 and I0, it is possible to measure them preliminarily by using another dummy sample in place of the aforesaid sample. Preferably, V0 and I0 are desirably measured again when the vacuum chamber opened to the atmosphere thereby to perform the wet maintenance of the vacuum chamber or when a consumable part is exchanged. This is because the capacitances existing between the sample or the sample electrode and the vacuum chamber etc. changes finely due to the wet maintenance or the exchange of the consumable part. Alternatively, when sedimentary gas is used, V0 and I0 are desirably measured again each time a predetermined number of samples are processed. This is because the capacitances existing between the sample or the sample electrode and the vacuum chamber etc. changes finely when deposition adheres at the peripheral portion of the sample electrode.

Supposing that the capacitances existing between the sample or the sample electrode and the vacuum chamber etc. does not have the non-linearity, the displacement current has only the basic waveform component I01 when the displacement current is proportional to the voltage and the high-frequency voltage supplied to the sample electrode is a sine wave.

Thus, at the time of measuring V0, I0, V1, I1, the substantive high-frequency current can be calculated with a high accuracy even in a manner that the voltage and the current are sampled to obtain the waveforms thereof, then the dividing part provided at the arithmetic device 15 subjects the measured high-frequency voltage waveform and current waveform to the Fourier transformation and divide into the fundamental waveform components V01, I01, V11, I11 and the harmonics waveform components V0n, I0n, V1n, I1n (n is 2, 3,—and represents n-th harmonics), and the summing part provided at the arithmetic device obtains the substantial high-frequency current Ir=I11−I01·V11/V01+ΣI1n (Σ represents to add n which is 2 or more).

In this case, the sampling frequency is a frequency sufficient for measuring the third harmonics of the fundamental frequency of the high-frequency voltage supplied to the sample electrode, and it is desirable to consider at least up to the third harmonics at the time of obtaining Ir. More preferably, the sampling frequency is a frequency sufficient for measuring the fifth harmonics of the fundamental frequency of the high-frequency voltage supplied to the sample electrode, and it is desirable to consider harmonics at least up to the fifth harmonics at the time of obtaining Ir. Of course, the accuracy can be improved when the harmonics up to the high order as higher as possible are taken into consideration. However, in order to measure the harmonics of the higher order, the sampling function of the higher level is required and so there arises a drawback that the cost of the apparatus increases and the arithmetic operation time increases. According to the experimentation performed by the inventors, it is sufficient to consider harmonics up to the third harmonics in a case of a process having a small amount of distortion in the current waveform, whilst it is sufficient to consider harmonics up to the fifth harmonics in a case of a process having a relatively large amount of distortion in the current waveform.

Figure 5:
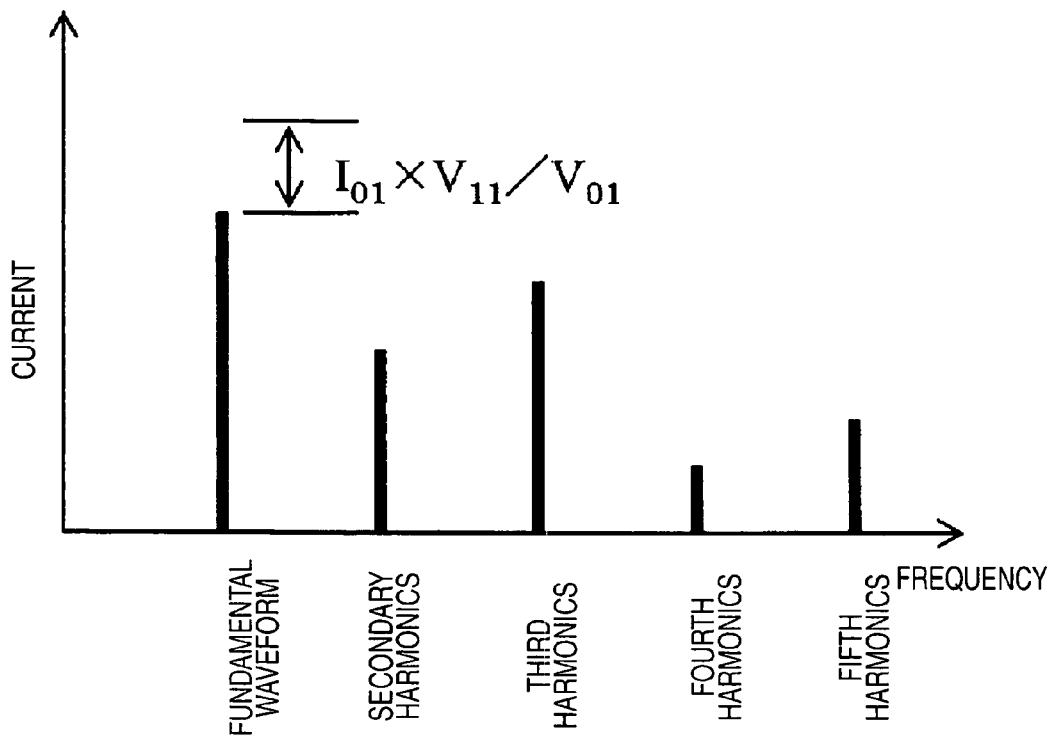
FIG. 5 is a diagram showing the waveforms in the frequency range of a substantial high-frequency current.
Figure 6:
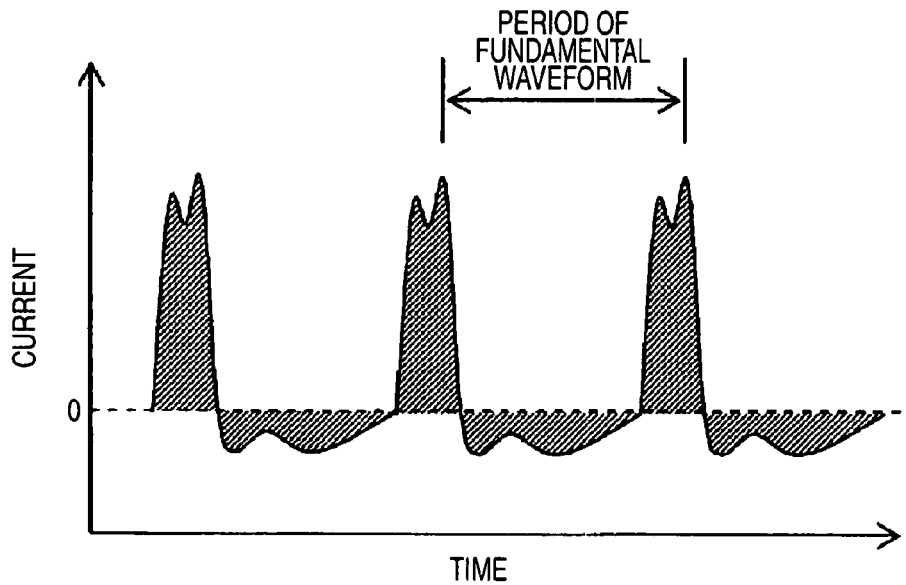
FIG. 6 is a diagram showing the waveforms of the substantial high-frequency current.

FIG. 5 is a diagram showing the waveforms in the frequency range of Ir obtained in this manner. When these waveforms are converted again in the waveform of the time region, a waveform of a substantial high-frequency waveform shown in FIG. 6 is obtained. In this case, upper regions than a line of the current value 0 of slanted portions mainly corresponds to the electron current, whilst lower regions than the line of the current value 0 mainly corresponds to the positive ion current, that is, a substantial charged particles amount. To be more concrete, a few amount of the negative ion current is also contained in the upper regions, whilst a few amount of the electron current is also contained in the lower regions since the thermal velocity of the electrons is quite higher than that of the ions. However, since these currents are quite small as compared with the current due to the main particle species, these currents can be neglected for the sake of the simplification.

An area of the upper regions and an area of the lower regions than the line of the current value 0 are almost the same. Thus, when either one of or both the upper regions and the lower regions is obtained as the time integration value of the current value, it is possible to estimate the number of charged particles irradiated into the sample per one period of the fundamental wave.

Thus, when the processing condition is controlled so that the substantial high-frequency current or the time integration value thereof becomes a predetermined value, it is possible to provide the method and apparatus for plasma processing which can accurately monitor an ion current applied to the surface of the sample and, in particular, to provide the method and apparatus for plasma processing which are excellent in the controllability of the density of impurities introduced into the surface of the sample and the controllability of the thickness of the amorphous layer.

For example, under the condition of converting helium gas into plasma, it is possible to amorphize the crystal layer of the surface of a mono-crystalline or polycrystalline silicon substrate. In order to obtain an amorphous layer of a desired depth in this process, the substantial high-frequency current or the time integration value thereof is required to be a desired value. Thus, when the substantial high-frequency current or the time integration value thereof is larger than the desired value, the power supplied to the sample electrode is made smaller in the condition of processing a predetermined number of samples to be processed next. Alternatively, the flow rate of the gas containing impurity element is made smaller, or the high-frequency power supplied to the plasma source is made smaller, or the processing time is made shorter.

On the contrary, when the substantial high-frequency current or the time integration value thereof is smaller than the desired value, the power supplied to the sample electrode is made larger in the condition of processing a predetermined number of samples to be processed next. Alternatively, the flow rate of the gas containing impurity element is made larger, or the high-frequency power supplied to the plasma source is made larger, or the processing time is made longer.

Alternatively, the amorphizing process may be stopped (terminated) when the time integration value of the substantial high-frequency current reaches the predetermined value.

Under the condition of converting the mixed gas of helium gas and diborane gas into plasma, it is possible to dope boron as the impurities in the surface of the silicon substrate 9. In order to obtain a desired dose amount (impurity density) in this process, the substantial high-frequency current or the time integration value thereof is required to be a desired value. Thus, when the substantial high-frequency current or the time integration value thereof is larger than the desired value, the power supplied to the sample electrode is made smaller in the condition of processing a predetermined number of samples to be processed next. Alternatively, the flow rate of the gas containing impurity element is made smaller, or the high-frequency power supplied to the plasma source is made smaller, or the processing time is made shorter.

On the contrary, when the substantial high-frequency current or the time integration value thereof is smaller than the desired value, the power supplied to the sample electrode is made larger in the condition of processing a predetermined number of samples to be processed next. Alternatively, the flow rate of the gas containing impurity element is made larger, or the high-frequency power supplied to the plasma source is made larger, or the processing time is made longer.

Alternatively, the doping process may be stopped (terminated) when the time integration value of the substantial high-frequency current reaches the predetermined value.

Although the explanation is made as to the case where the high-frequency voltage waveform or current waveform is subjected to the Fourier transformation to obtain the substantial high-frequency current Ir, the substantial high-frequency current based on the charged particles movement flowing into the sample electrode may be obtained as $Ir=I1-I0\cdot V1/V0$. When the amount of the waveform distortion is small, such the method is effective in order to shorten the arithmetic operation time and simplify the arithmetic operation circuit.

The aforesaid embodiments according to the invention merely show a part of various variations of the applied range of the invention as to the shape of the vacuum chamber, the type and arrangement of the plasma source etc. Of course, in the case of applying to the invention, various modifications other than those exemplarily shown above can be thought of.

Figure 7:
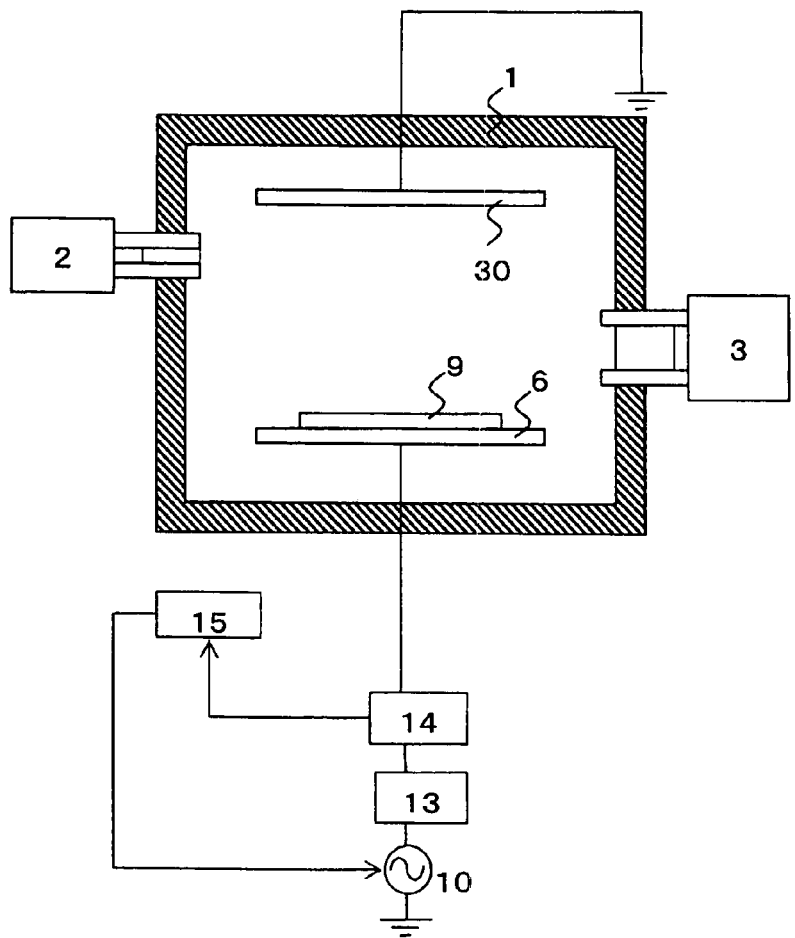
FIG. 7 is a sectional diagram showing the configuration of a plasma processing apparatus used in an another embodiment of the invention.
Figure 8:
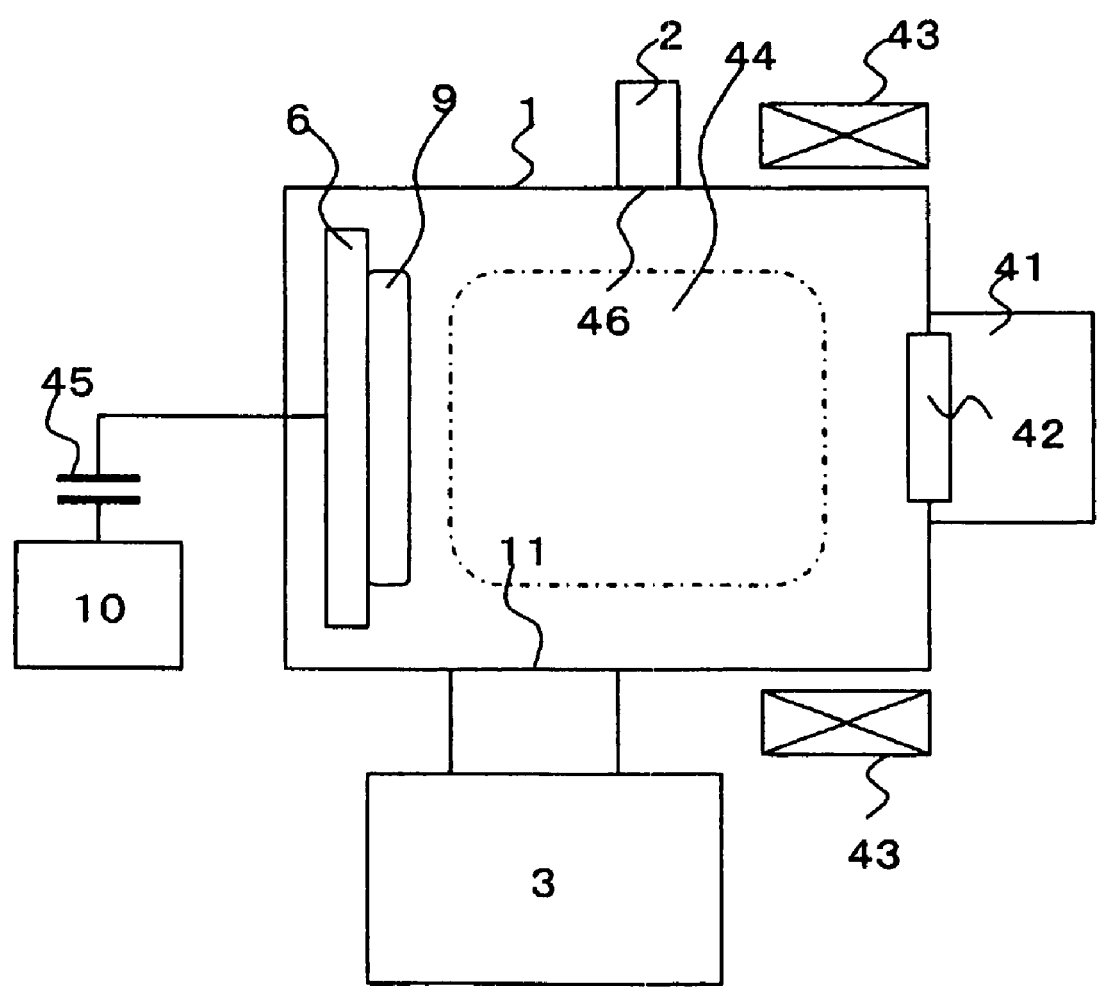
FIG. 8 is a sectional diagram showing the configuration of a plasma doping apparatus used in a related art.
Figure 9:
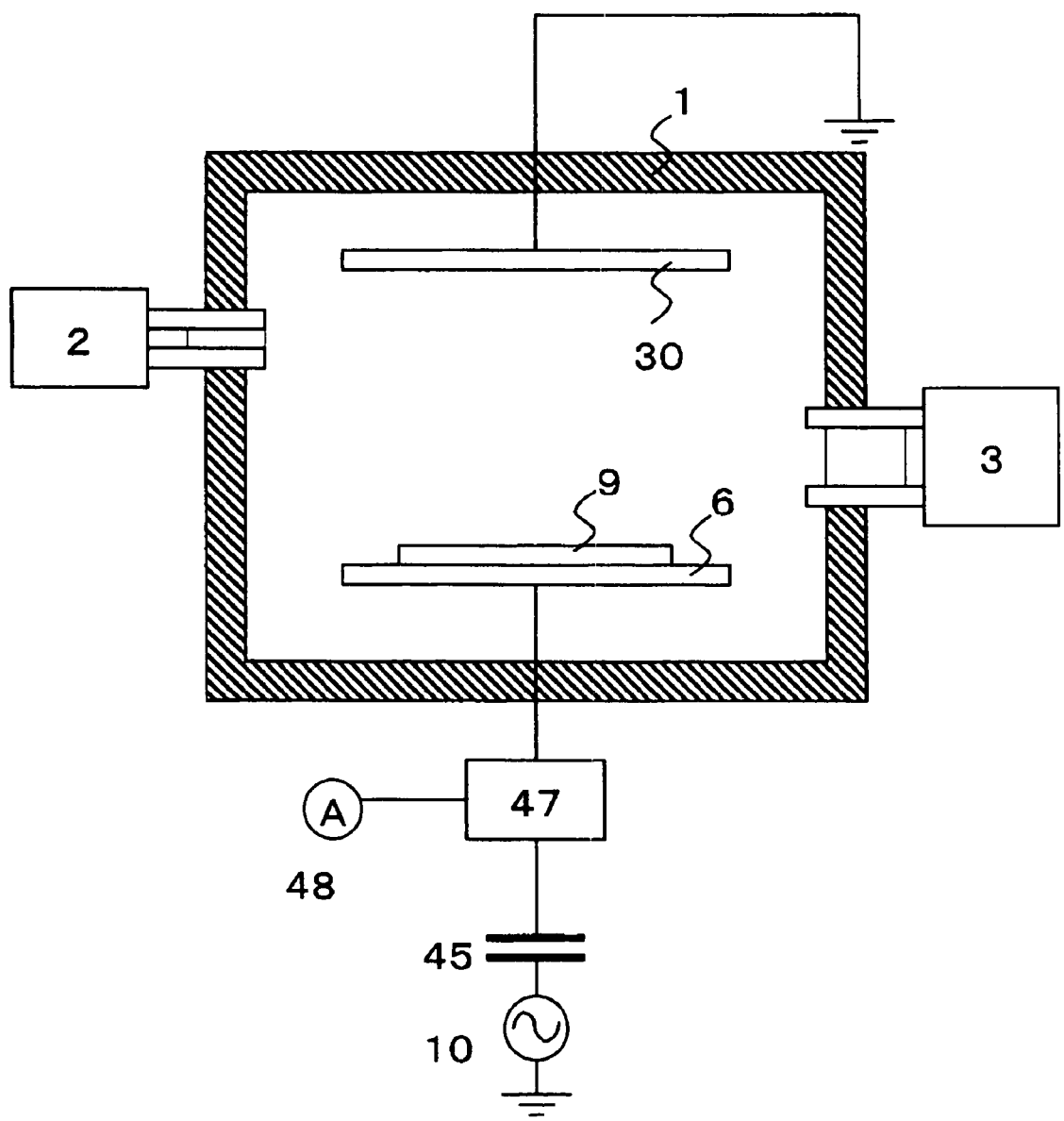
FIG. 9 is a sectional diagram showing the configuration of a plasma doping apparatus used in a related art.
Figure 10:
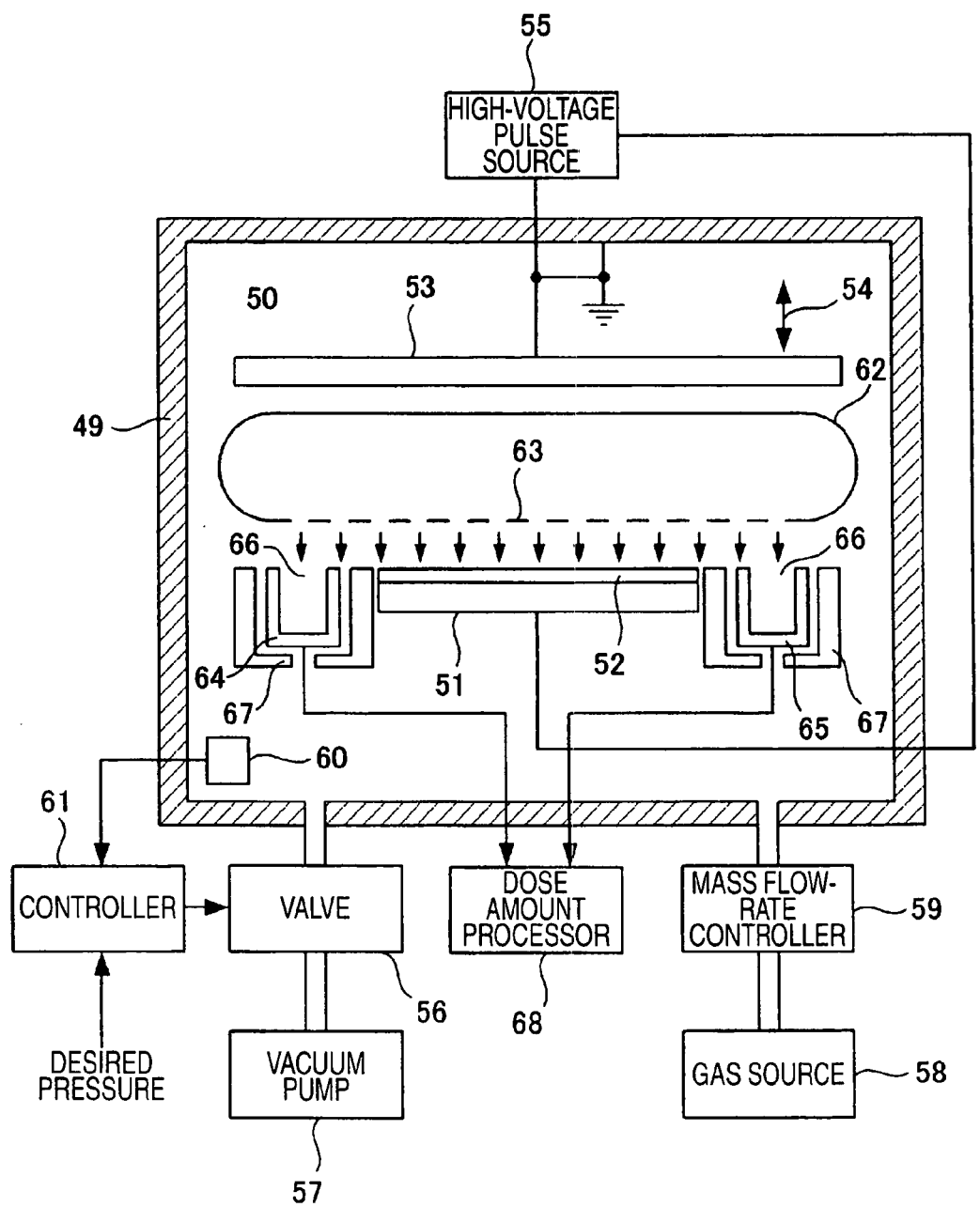
FIG. 10 is a sectional diagram showing the configuration of a plasma doping apparatus used in a related art.
Figure 11:
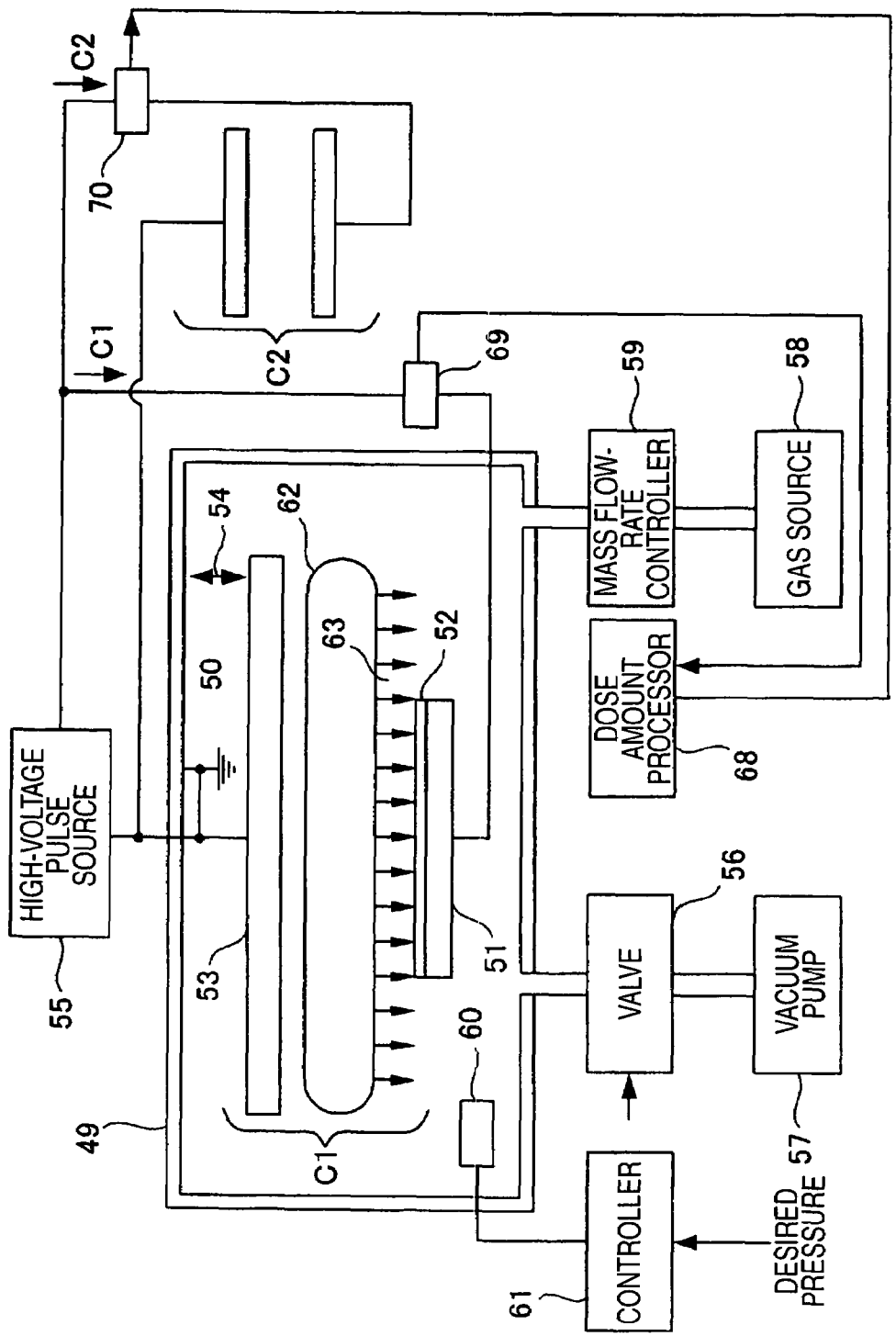
FIG. 11 is a sectional diagram showing the configuration of another plasma doping apparatus used in a related art.

For example, the coil 8 may be configured in a planer shape. Alternatively, a helicon wave plasma source, a magnetic neutral loop plasma source or a magnetic field microwave plasma source (electron cyclotron resonance plasma source) may be used, and alternatively a parallel plane plate type plasma source shown in FIG. 7 may be used.

Further, inactive gas other than helium may be used. Alternatively, at least one gas of neon, argon, krypton and Xe (xenon) can be used. These inactive gases are advantageously less influence on a sample, as compared with other gases.

Further, although the explanation is made exemplarily as to the case where the sample is a semiconductor substrate made of silicon, the invention can be applied to cases where sample of other various materials are processed. However, the invention is the plasma processing method useful particularly in the case where a sample is a semiconductor substrate made of silicon. Further, the invention is useful particularly in the case where the impurities are arsenic, phosphor, boron, aluminum or antimony. According to this configuration, a quite fine silicon semiconductor device can be fabricated.

Further, the vapor phase sate may be monitored by performing the emission spectral analysis or the mass spectrometry of the plasma may during the plasma processing, and the monitored result may be used so as to determine as to which parameter is to be changed. For example, when the substantial high-frequency current or the integration value thereof changes despite that the vapor phase sate does not change remarkably, the gas flow rate or the high-frequency power supplied to the plasma source is not changed but the power supplied to the sample electrode may be changed. In contrast, when the change of the vapor phase sate is detected, the power supplied to the sample electrode is not changed but the gas flow rate or the high-frequency power supplied to the plasma source may be changed.

The amorphization and the doping processing may be continuously performed at the same plasma processing chamber or may be performed at different plasma processing chambers that are provided separately.

Further, although the explanation is made exemplarily as to the case where the high-frequency power is supplied to the pedestal, the high-frequency power may be supplied to the electrostatic chucking electrode. The electrostatic chucking is classified into the bipolar type as explained in the embodiments of the invention and a unipolar type having only one electrostatic chucking electrode. In the case of supplying the high-frequency power to the unipolar type electrostatic chucking electrode, the high-frequency sensor may be disposed between the sample electrode matching circuit and the electrostatic chucking electrode. In the case of supplying the high-frequency power to the bipolar type electrostatic chucking electrode, the high-frequency sensor may be disposed between the sample electrode matching circuit and one of or both the electrostatic chucking electrodes In the case of disposing the high-frequency sensor between the sample electrode matching circuit and one of the electrostatic chucking electrodes, a value of the current flowing into the sample electrode can be obtained by duplicating the current value obtained from the high-frequency sensor. In the case of disposing the high-frequency sensors between the sample electrode matching circuit and both the electrostatic chucking electrodes, respectively, a value of the current flowing into the sample electrode can be obtained by obtaining the sum of the current values from the high-frequency sensors.

Further, although the explanation is made exemplarily as to the case of performing the amorphizing processing and the doping processing, the invention may be applied to plasma processing using ions such as the dry etching or the plasma CVD.

Although the invention has been explained in detail with reference to particular embodiments, it will be apparent for those skilled in the art that various changes and modification may be made without departing from the spirit and range of the invention.

The present application is based on Japanese Patent Application No. 2005-107775 filed on Apr. 4, 2005, the content of which is incorporated herein by reference.

INDUSTRIAL APPLICABILITY

The method and apparatus for plasma processing according to the invention can enhance the reproducibility of the plasma processing and can be applied to the usages such as the impurity doping processing in a semiconductor device such as an LSI, the manufacturing of a semiconductor device such as a thin film transistor used for a crystal liquid etc. on a semiconductor thin film formed on a substrate, and the reforming of the surface of various kinds of material.

The invention claimed is:

1. A plasma processing method in which a sample is placed on a sample electrode within a vacuum chamber, then gas within the vacuum chamber is exhausted while supplying the gas within the vacuum chamber from a gas supply device, and a high-frequency power is supplied to the sample electrode via a matching circuit for the sample electrode while controlling a pressure within the vacuum chamber to a predetermined value thereby to generate plasma within the vacuum chamber, thereby accelerating ions in the plasma toward a surface of the sample to collide with the surface to process the sample, comprising:
a step of supplying a high-frequency voltage to the sample electrode under a condition of not generating the plasma to measure a high-frequency voltage $V0$ and a current $I0$ supplied to the sample electrode by a high-frequency sensor provided between the sample electrode matching circuit and the sample electrode;
a step of measuring a high-frequency voltage $V1$ and a current $I1$ supplied to the sample electrode by the high-frequency sensor when the plasma is generated to subject the sample to a plasma processing;
a step of obtaining a substantial high-frequency current based on charged particles movement flowing into the sample electrode as $Ir=I1-I0 \cdot V1/V0$; and
a step of controlling a processing condition based on Ir thus obtained.

2. The plasma processing method according to claim 1, wherein the step of controlling a processing condition includes a step of controlling the processing condition so that Ir becomes a predetermined value.

3. The plasma processing method according to claim 1, wherein the plasma is generated within the vacuum chamber by supplying the high-frequency power to a plasma source.

4. The plasma processing method according to claim 3, wherein the step of controlling the processing condition so that Ir becomes a predetermined value is a step of changing the high-frequency power supplied to the plasma source.

5. The plasma processing method according to claim 1, wherein the step of controlling the processing condition so that Ir becomes a predetermined value is a step of changing the high-frequency power supplied to the sample electrode so that Ir becomes the predetermined value.

6. The plasma processing method according to claim 1, wherein the step of controlling the processing condition so that Ir becomes a predetermined value is a step of changing a predetermined gas flow rate so that Ir becomes the predetermined value.

7. The plasma processing method according to claim 1, wherein the step of controlling the processing condition based on Ir is a step of terminating the processing when a value obtained by time-integrating Ir during processing of the sample reaches a predetermined value.

8. The plasma processing method according to claim 1, wherein the plasma processing method is a plasma doping method of introducing impurities in the surface of the sample.

9. The plasma processing method according to claim 1, wherein the step of measuring $V0$ and $I0$ is a step of measuring them preliminarily by using another dummy sample in place of the sample.

10. A plasma processing method according to claim 1, wherein the step of measuring $V0$, $I0$, $V1$ and $I1$ includes a step of sampling a voltage and a current to obtain waveforms, and a step of subjecting high-frequency voltage waveform and current waveform thus measured to a Fourier transformation to divide into fundamental waveform components $V01$, $I01$, $V11$, $I11$ and harmonics waveform components $V0n$, $I0n$, $V1n$, $I1n$ (n is 2, 3, - - - and represents n-th harmonics) to obtain Ir as $Ir=\Sigma(I1n-I0n \cdot V1n/V0n)$ ($\Sigma$ represents to add n which is 1 or more).

11. The plasma processing method according to claim 10, wherein the sampling frequency used in the step of obtaining the waveforms is a frequency sufficient for measuring a third harmonics of the fundamental frequency of the high-frequency voltage supplied to the sample electrode, and it is desirable to consider at least up to the third harmonics at a time of obtaining Ir.

12. The plasma processing method according to claim 10, wherein the sampling frequency used in the step of obtaining the waveforms is a frequency sufficient for measuring a fifth harmonics of the fundamental frequency of the high-frequency voltage supplied to the sample electrode, and it is desirable to consider at least up to the fifth harmonics at a time of obtaining Ir.

13. The plasma processing method according to claim 1, wherein the step of measuring $V0$, $I0$, $V1$ and $I1$ includes a step of sampling a voltage and a current to obtain waveforms, and a step of subjecting high-frequency voltage waveform and current waveform thus measured to a Fourier transformation to divide into fundamental waveform components $V01$, $I01$, $V11$, $I11$ and harmonics waveform components $V0n$, $I0n$, $V1n$, $I1n$ (n is 2, 3, - - - and represents n-th harmonics) to obtain Ir as $Ir=I11-I01 \cdot V11/V01+\Sigma I1n$ ($\Sigma$ represents to add n which is 2 or more).

14. The plasma processing method according to claim 13, wherein the sampling frequency used in the step of obtaining the waveforms is a frequency sufficient for measuring a third harmonics of the fundamental frequency of the high-frequency voltage supplied to the sample electrode, and it is desirable to consider at least up to the third harmonics at a time of obtaining Ir.

15. The plasma processing method according to claim 13, wherein the sampling frequency used in the step of obtaining the waveforms is a frequency sufficient for measuring a fifth harmonics of the fundamental frequency of the high-frequency voltage supplied to the sample electrode, and it is desirable to consider at least up to the fifth harmonics at a time of obtaining Ir.

16. A plasma processing apparatus, comprising:
a vacuum chamber;
a sample electrode;
a gas supply device which supplies gas within the vacuum chamber;
an exhaust device which exhausts the gas within the vacuum chamber;
a pressure control device which controls a pressure within the vacuum chamber;
a high-frequency power supply for the sample electrode which supplies high-frequency power to the sample electrode;
a matching circuit for the sample electrode which performs impedance matching of the sample electrode;
a high-frequency sensor which is provided between the sample electrode matching circuit and the sample electrode; and
an arithmetic device which calculates, based on measurement values of the high-frequency sensor, a substantial high-frequency current based on charged particles movement flowing into the sample electrode.

17. The plasma processing apparatus according to claim 16, further comprising:
a plasma source and a high-frequency power supply for the plasma source that supplies a high-frequency power to the plasma source.

18. The plasma processing apparatus according to claim 16 wherein the high-frequency sensor includes a sampling portion which samples voltage and current, and the arithmetic part includes a dividing part which subjects the measured high-frequency voltage waveform and current waveform to Fourier transformation to divide into fundamental waveform components $V01$, $I01$, $V11$, $I11$ and harmonics waveform components $V0n$, $I0n$, $V1n$, $I1n$ ($n$ is 2, 3, - - - and represents n-th harmonics), and a summing part which obtains a substantial high-frequency current Ir based on charged particles movement flowing into the sample electrode as $Ir=\Sigma(I1n-I0n \cdot V1n/V0n)$ ($\Sigma$ represents to add n which is 1 or more).

19. The plasma processing apparatus according to claim 18, wherein the sampling frequency used in the step of obtaining the waveforms is a frequency sufficient for measuring a third harmonics of the fundamental frequency of the high-frequency voltage supplied to the sample electrode, and it is desirable to consider at least up to the third harmonics at a time of obtaining Ir.

20. The plasma processing apparatus according to claim 18, wherein the sampling frequency used in the step of obtaining the waveforms is a frequency sufficient for measuring a fifth harmonics of the fundamental frequency of the high-frequency voltage supplied to the sample electrode, and it is desirable to consider at least up to the fifth harmonics at a time of obtaining Ir.

21. The plasma processing apparatus according to claim 16, wherein the high-frequency sensor includes a sampling portion which samples voltage and current, and the arithmetic part includes a dividing part which subjects the measured high-frequency voltage waveform and current waveform to Fourier transformation to divide into fundamental waveform components $V0I$, $I01$, $V11$, $I11$ and harmonics waveform components $V0n$, $I0n$, $V1n$, $I1n$ ($n$ is 2, 3, - - - and represents n-th harmonics), and a summing part which obtains a substantial high-frequency current Ir based on charged particles movement flowing into the sample electrode as $Ir=I11-I01 \cdot V11/V01+\Sigma I1n$ ($\Sigma$ represents to add n which is 2 or more).

22. The plasma processing apparatus according to claim 21, wherein the sampling frequency used in the step of obtaining the waveforms is a frequency sufficient for measuring a third harmonics of the fundamental frequency of the high-frequency voltage supplied to the sample electrode, and it is desirable to consider at least up to the third harmonics at a time of obtaining Ir.

23. The plasma processing apparatus according to claim 21, wherein the sampling frequency used in the step of obtaining the waveforms is a frequency sufficient for measuring a fifth harmonics of the fundamental frequency of the high-frequency voltage supplied to the sample electrode, and it is desirable to consider at least up to the fifth harmonics at a time of obtaining Ir.

* * * * *